United States Patent [19]

Galpin

[11] 4,360,787
[45] Nov. 23, 1982

[54] DIGITALLY CONTROLLED WIDE RANCH AUTOMATIC GAIN CONTROL

[75] Inventor: Robert K. P. Galpin, Bucks, England

[73] Assignee: Plessey Overseas Limited, Ilford, England

[21] Appl. No.: 186,770

[22] Filed: Sep. 12, 1980

[30] Foreign Application Priority Data

Sep. 14, 1979 [GB] United Kingdom ............ 7931951

[51] Int. Cl.³ .................................. H03G 3/20
[52] U.S. Cl. ........................... 330/284; 330/279; 330/129; 330/144
[58] Field of Search ........... 330/284, 127, 129, 144, 330/145, 279, 138, 280, 141, 281

[56] References Cited

U.S. PATENT DOCUMENTS

| | | | |
|---|---|---|---|
| 3,636,462 | 1/1972 | Baldauf, Jr. | 330/96 |
| 4,066,977 | 1/1978 | Chambers et al. | 330/129 |
| 4,112,384 | 9/1978 | Buchberger | 330/284 |
| 4,134,079 | 1/1979 | Kohtani | 330/284 |

*Primary Examiner*—James B. Mullins
*Assistant Examiner*—Gene Wan

*Attorney, Agent, or Firm*—Fleit & Jacobson

[57] ABSTRACT

In high speed high quality modems it is important to be able to preserve the gain value for the automatic gain control system during breaks in transmission to permit rapid resumption of normal operation. The a.g.c. circuit comprises a basic a.g.c. transistor amplifier whose emitter-collector conductance is varied by a control voltage derived from the envelope of the amplifier output voltage which is well known. The invention involves the use of a digital-to-analog converter which is controlled by a digital-updown counter. The counter is controlled by a window comparator which compares the rectified output voltage of the amplifier with a reference voltage level and upper and lower limits. If the output voltage exceeds either limit, the counter is enabled and the appropriate up or down indication is given. The counter is then clocked to change the drive to the d-to-a converter which thereby changes the conductance of the a.g.c. transistor. The state of the up down counter will be used to maintain the a.g.c. at the last level in the event of a transmission break by inhibiting the clock for the counter.

2 Claims, 2 Drawing Figures

DIGITALLY CONTROLLED WIDE RANCH AUTOMATIC GAIN CONTROL

The present invention relates to automatic gain control circuits which are suitable for use in digital communication systems.

In communications equipment required to operate with a wide range of input signal level, a wide range automatic gain control (a.g.c.) is often incorporated. To permit the rapid resumption of normal operation following a break in transmission, such as would be required when using a data modem operating in a turn-around mode, it would be desirable to be able to preserve the gain value during the break for an indefinite period, which implies the use of digital storage. Digitally-controlled stepped attenuators are well known in the art, but an attenuator of this type designed to provide a wide dynamic range, say of 60 dB, with a small incremental step size, say of 0.2 dB, would be very complex and expensive.

According to the invention there is provided an automatic gain control circuit for use in data transmission systems, the circuit comprising an amplifier of fixed gain and an attenuator comprising a fixed resistor and a transistor whose conductance is varied by a control voltage generator responsive to the envelope of the amplifier output voltage, in which the control voltage generator includes a digital-to-analog converter which is controlled by a digital counter capable of counting up or down, the counter being controlled by a window comparator which compares the rectified output voltage of the amplifier with a reference voltage level with upper and lower limits, the arrangement being such that when the amplifier voltage deviates beyond either limit, the counter is enabled and the appropriate up or down indication is given causing the counter to be driven from a source of clock pulses to change the drive to the digital-to-analog converter which thereby changes the conductance of the amplifier.

The incorporation of the up-down-counter allows the a.g.c. level reached to be maintained in the event of a transmission break by inhibiting the clock source of the break period.

The present invention comprises the digital control of an analogue gain control element which provides the required functions with low complexity and cost.

In order that the invention may be more readily understood, reference is made to the following figures.

Figure 1:
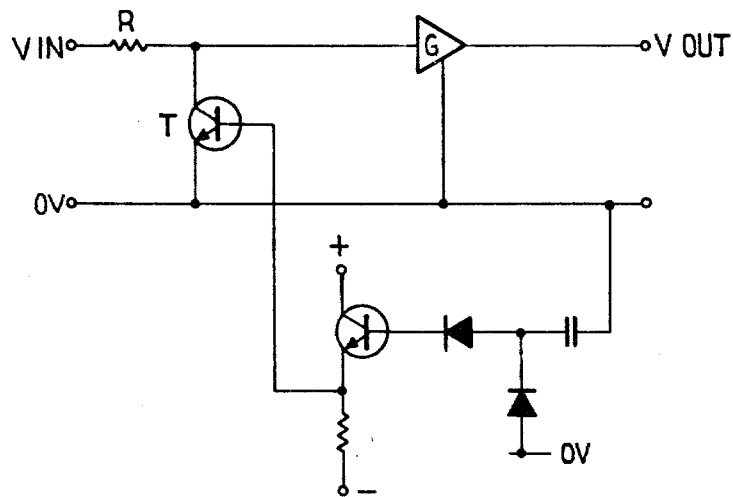
FIG. 1 shows a well-known a.g.c. amplifier arrangement (Prior art).

The basic prior art a.g.c. amplifier arrangement is shown in FIG. 1 and comprises a fixed high gain amplifier G in tandem with an L-pad attenuator formed by the series resistor R and the transistor T. The conductance of the collector-emitter path of the transistor is a function of the voltage applied to the base, which is derived from the envelope of the amplifier output voltage. By suitable choice of resistor R in association with the choice of the transistor, an operating range of at least 60 dB can be obtained before the transistor departs from linear bidirectional resistive behaviour.

It can be shown, and has been confirmed experimentally, that the conductance of the bipolar transistor when operated in this mode is a logarithmic function of the base voltage over a wide range, and hence that the gain of the arrangement of FIG. 1 is an inverse logarithmic function of the voltage applied to the base of the transistor.

Figure 2:
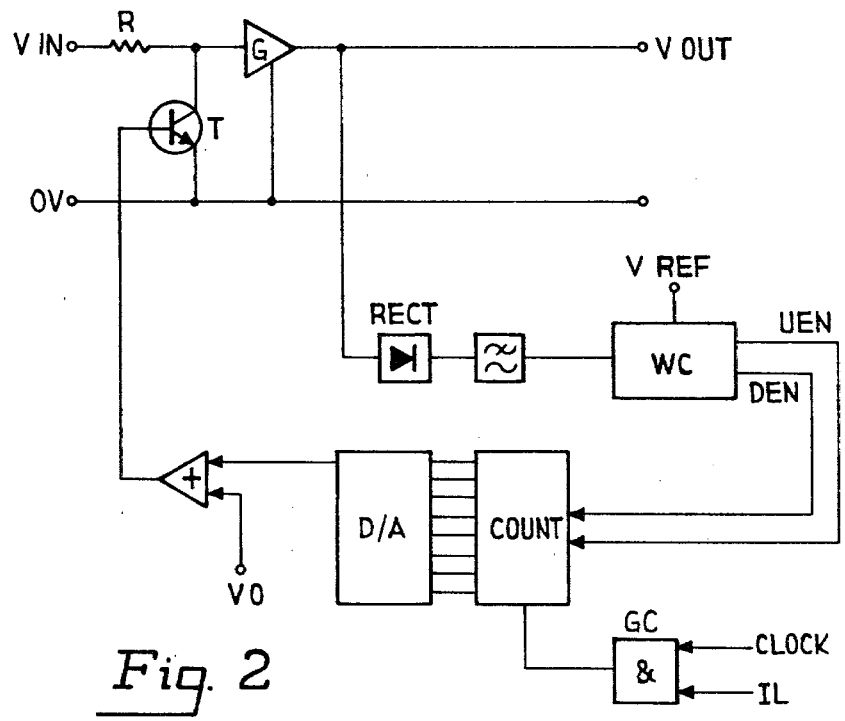
FIG. 2 shows an embodiment of the invention.

This behaviour forms the basis for the invention, one possible implementation of which is shown in FIG. 2. The voltage applied to the base of the transistor T is produced by a digital-to-analog converter D/AC which is controlled by a digital-up-down counter COUNT.

The counter is controlled by a window comparator WC which compares the rectified output voltage of the amplifier G with a reference voltage level V ref with upper and lower limits. If the output voltage exceeeds either limit, the comparator produces counter enable conditions on the appropriate up or down indication lead UEN or DEN in FIG. 2. The counter is then clocked to change the drive to the digital-to-analogue converter D/AC which thereby changes the conductance of the transistor T to increase or decrease the amplifier gain as required. A fixed voltage Vo is added to the control voltage to set the operating range of the digital control within the linear range of operation of the transistor. This offset voltage Vo will preferably include a temperature dependent component to compensate for temperature variations in the control transistor operation.

The time constant of the a.g.c. response is determind both by the time constant of the smoothing associated with the rectifier RECT, which can be adjusted to suit the waveform of the signal, and by the frequency of the clock controlling the counter C. For example, a high frequency clock can be used initially for rapid acquisition of the signal followed by a low frequency clock to minimize the response of the a.g.c. to message-dependent amplitude variations. In the event of a break in transmission, the clock can be inhibited by lead IL operating on gate GC, when the gain of the a.g.c. will be frozen until the signal is restored and lead IL restored to normal.

What we claim is:

1. In an automatic gain control circuit for use in a data transmission system, the circuit comprising:
    amplifier means of fixed gain for amplifying an input data signal in accordance with a gain thereof to provide an output signal;
    attenuator means comprising a fixed resistive device and an active device having a conductance which is controllable, and connected to said amplifier means for controlling the amplification of said amplifier means; and
    control means responsive to an amplifier output envelope voltage of the output signal of said amplifier means for generating and providing to said attenuator means a control voltage which controls the conductance of said active device;
    said control means comprising a rectifier for rectifying said output signal of said amplifier means to produce a rectified output voltage, a window comparator for comparing the rectified output voltage with upper and lower reference voltage limits, and for generating a count enable signal whenever the rectified output voltage deviates outside the upper and lower reference voltage limits, a clock providing a clock signal, a digital counter responsive to said count enable signal and to said clock signal for counting selectively in an upward or downward direction when said rectified output voltage deviates outside the upper or lower reference voltage limits, respectively, said digital counter providing a count output, and a digital-to-analog converter responsive to the count output of said digital counter to provide an analog output to said attenuator means for changing the conductance of the active device;

the improvement comprising means for detecting a break in transmission in the data transmission system and generating an inhibit signal, and inhibiting means connected to said clock and responsive to said inhibit signal for inhibiting the clock signals so as to stop the counting of said digital counter and freeze the conductance of said active device, and thus the gain of the automatic gain control circuit, in its state when the break in transmission occurred.

2. In the circuit of claim 1, wherein said inhibiting means comprises an AND gate.

* * * * *